(12) United States Patent
Sato et al.

(10) Patent No.: US 9,949,375 B2
(45) Date of Patent: Apr. 17, 2018

(54) METHOD FOR MANUFACTURING AN ELECTRIC PRODUCT

(71) Applicant: WONDER FUTURE CORPORATION, Yokohama-shi (JP)

(72) Inventors: Akira Sato, Hachioji (JP); Koki Fukuda, Yokohama (JP); Kazuhiro Sugiyama, Tachikawa (JP)

(73) Assignee: WONDER FUTURE CORPORATION, Yokohama-shi (JP)

( * ) Notice: Subject to any disclaimer, the term of this patent is extended or adjusted under 35 U.S.C. 154(b) by 215 days.

(21) Appl. No.: 14/892,487

(22) PCT Filed: Nov. 15, 2013

(86) PCT No.: PCT/JP2013/080927
§ 371 (c)(1),
(2) Date: Nov. 19, 2015

(87) PCT Pub. No.: WO2015/072019
PCT Pub. Date: May 21, 2015

(65) Prior Publication Data
US 2016/0105972 A1    Apr. 14, 2016

(51) Int. Cl.
*B29C 65/14* (2006.01)
*H05K 3/22* (2006.01)
(Continued)

(52) U.S. Cl.
CPC .............. *H05K 3/22* (2013.01); *B29C 65/14* (2013.01); *B29C 65/1432* (2013.01);
(Continued)

(58) Field of Classification Search
None
See application file for complete search history.

(56) References Cited

U.S. PATENT DOCUMENTS 3,451,122 A * 6/1969 Ports ................... B23K 1/0008
                                                228/173.5
4,983,804 A     1/1991 Chan et al.
(Continued)

FOREIGN PATENT DOCUMENTS

EP      0 598 914 A1    6/1994
EP      1 439 600 A2    7/2004
(Continued)

OTHER PUBLICATIONS

PCT/IPEA/409, International Preliminary Report on Patentability (Chapter II of the Patent Cooperation Treaty), dated Nov. 15, 2013 for PCT/IPEA/416, 9 pgs.
(Continued)

*Primary Examiner* — Edmund Lee
(74) *Attorney, Agent, or Firm* — Oblon, McClelland, Maier & Neustadt, L.L.P.

(57) ABSTRACT

A method for preventing a molded body made of low melting point resin from being thermally damaged when external connection terminals provided on the molded body and external connection terminals provided on a flexible sheet are joined together via soldering. The method includes arranging the connection terminal of the molded body and the connection terminal of the flexible sheet such that the connection terminals face each other, and an electromagnetic induction heating performing electromagnetic induction heating after the arranging.

4 Claims, 2 Drawing Sheets

(51) Int. Cl.
*H05K 3/34* (2006.01)
*H05K 3/36* (2006.01)
*H05K 3/10* (2006.01)
*H05K 1/14* (2006.01)
*H05K 1/03* (2006.01)
*H05K 1/11* (2006.01)
*H05K 3/00* (2006.01)

(52) U.S. Cl.
CPC ......... *B29C 65/1445* (2013.01); *H05K 1/147* (2013.01); *H05K 3/101* (2013.01); *H05K 3/3494* (2013.01); *H05K 3/363* (2013.01); *H05K 1/032* (2013.01); *H05K 1/0326* (2013.01); *H05K 1/117* (2013.01); *H05K 1/118* (2013.01); *H05K 1/119* (2013.01); *H05K 3/0014* (2013.01); *H05K 2201/0129* (2013.01); *H05K 2201/0154* (2013.01); *H05K 2201/0999* (2013.01); *H05K 2201/09118* (2013.01); *H05K 2201/2018* (2013.01); *H05K 2203/101* (2013.01); *H05K 2203/1105* (2013.01)

(56) References Cited

U.S. PATENT DOCUMENTS

| | | | |
|---|---|---|---|
| 5,639,990 A | 6/1997 | Nishihara et al. | |
| 6,499,217 B1 | 12/2002 | Yamada et al. | |
| 2002/0148636 A1* | 10/2002 | Belke | H05K 1/117 174/254 |
| 2003/0007331 A1 | 1/2003 | Kataoka | |
| 2005/0198819 A1* | 9/2005 | Hunkeler | H05K 3/284 29/841 |
| 2009/0025962 A1 | 1/2009 | Gelardi | |
| 2009/0035591 A1 | 2/2009 | Nishikawa et al. | |
| 2016/0322724 A1* | 11/2016 | Lee | H01R 12/771 |

FOREIGN PATENT DOCUMENTS

| | | |
|---|---|---|
| EP | 1 439 600 A3 | 7/2004 |
| GB | 1 352 571 A | 5/1974 |
| JP | 61-166197 A | 7/1986 |
| JP | 3-35584 A | 2/1991 |
| JP | 6-93536 B2 | 11/1994 |
| JP | 7-101772 B2 | 11/1995 |
| JP | 7-319146 A | 12/1995 |
| JP | 2002-275552 A | 9/2002 |
| JP | 2002-368370 A | 12/2002 |
| JP | 2009-206269 A | 9/2009 |
| JP | 2009-238919 A | 10/2009 |
| WO | 00/59274 A1 | 10/2000 |
| WO | 2004/093205 A1 | 10/2014 |

OTHER PUBLICATIONS

Extended European Search Report dated Feb. 20, 2017 in Patent Application No. 13897416.7.
International Search Report dated Jan. 7, 2014 in PCT/JP13/080927 Filed Nov. 15, 2013.
European Office Action dated Sep. 18, 2017 in Patent Application No. 13 897 416.7.
"Properties of UNILATE 1" Retrieved from the Internet: URL:https://www.unitika.co.jp/plastics/e/unilate/03-1.html, 2000, p. 1-1.

* cited by examiner

METHOD FOR MANUFACTURING AN ELECTRIC PRODUCT

TECHNICAL FIELD

The present invention relates to a method for manufacturing electrical products.

BACKGROUND ART

Electrical products including terminals of wiring A and terminals of wiring B which are joined together via soldering are well known. Soldering joint for such electrical products is performed by heating to melt solder after the solder is disposed between the terminals. A reflow furnace is generally used for the heating.

Now, resin parts are used for products in many cases. It is not too much to say that there is no electrical product without including resin parts. In a case where a resin product is heated in reflow furnace (heating furnace), resin parts of the resin product may be damaged from the heating. To avoid this, it is required for the resin parts to have heat-resisting property. In other words, resin parts having low heat-resisting property (low melting point/low softening point) are not employed in the above mentioned case.

However, in some cases, resin parts having low melting point (softening point) are positively desired to be used in products. An example of such cases include a case where a sheet including wirings formed thereon is formed into a predetermined shape by thermoforming. In other words, a case involving thermoforming requires resin parts having low melting point (softening point/heat-resistant temperature). This is because high heat-resisting property (melting point/softening point) makes it difficult to perform thermoforming.

CITATION LIST

Patent Literature

[Patent Literature 1]
WO2004/093205
[Patent Literature 2]
JP2009-206269A

SUMMARY OF INVENTION

Technical Problem

A purpose of the present invention is to provide a technology for preventing a molded article made of low melting point (low softening point) resin from being thermally damaged when external connection terminals provided on the molded article made of low melting point (low softening point) resin and external connection terminals provided on a flexible sheet are joined together via soldering.

Solution to Problem

The present invention proposes a method for manufacturing an electrical product by assembling a molded body and a flexible sheet,
wherein the molded body is made of a thermoplastic resin having a melting point equal to or less than 300° C.,
wherein the flexible sheet is made of a resin more excellent in heat-resisting property than the resin composing the molded body,
wherein the molded body is provided with at least wiring having a predetermined pattern and a connection terminal having a width wider than that of the wiring, and
wherein the flexible sheet is provided with at least wiring having a predetermined pattern and a connection terminal having a width wider than that of the wiring,
wherein the method includes
an arranging step of arranging the connection terminal of the molded body and the connection terminal of the flexible sheet such that the connection terminals face each other, and
an electromagnetic induction heating step of performing electromagnetic induction heating after the arranging step, and
wherein solder provided between the connection terminal of the molded body and the connection terminal of the flexible sheet is molten by the electromagnetic induction heating, and the connection terminal of the molded body and the connection terminal of the flexible sheet are joined together.

The present invention proposes the method for manufacturing an electrical product,
wherein the molded body is obtained via
a wiring pattern forming step of providing the wiring and the connection terminal on the sheet made of a thermoplastic resin, and
a molding step in which the sheet is heated to be formed into a predetermined shape after the wiring pattern forming step.

The present invention proposes a method for manufacturing an electrical product by assembling a molded body and a flexible sheet, the method including
a wiring pattern forming step of providing wiring having a predetermined pattern and a connection terminal having a width wider than that of the wiring on a sheet made of thermoplastic resin having a melting point equal to or less than 300° C.,
a molding step in which the sheet is heated to be formed into a predetermined shape after the wiring pattern forming step,
a wiring pattern forming step of providing wiring having a predetermined pattern and a connection terminal having a width wider than that of the wiring on a flexible sheet made of resin that is more excellent in heat-resisting property than resin forming the molded body,
an arranging step of arranging the connection terminal of the molded body and the connection terminal of the flexible sheet such that the connection terminals face each other, and
an electromagnetic induction heating step of performing electromagnetic induction heating after the arranging step,
wherein solder disposed between the connection terminal of the molded body and the connection terminal of the flexible sheet is molten by the electromagnetic induction heating, and the connection terminal of the molded body and the connection terminal of the flexible sheet are joined together.

The present invention proposes the method for manufacturing an electrical product,
wherein the molded body has
a thickness of 0.5-2 mm,
a width a1 of the wiring of 5-100 μm,
a width a2 of the connection terminal of 100-500 μm, and
a relationship: a2>a1, and
wherein the flexible sheet has
a thickness of 25-300 μm,
a width b1 of the wiring of 50-100 μm, and
a width b2 of the connection terminal of 150-500 μm.

The present invention proposes the method for manufacturing an electrical product,
wherein a size per single connection terminal in the molded body is equal to or greater than 0.3 mm², and
wherein a size per single connection terminal in the flexible sheet is equal to or greater than 0.3 mm².

The present invention proposes the method for manufacturing an electrical product,
wherein the molded body is composed of a thermoplastic resin selected from the group consisting of olefin resin, acrylic resin, polyester resin, amide resin, styrene resin, AS resin, ABS resin, vinyl chloride resin, acetal resin, and polycarbonate resin, and
wherein the flexible sheet is composed of a resin selected from the group consisting of imide resins.

Advantageous Effect of Invention

When an external connection terminal of a thermoplastic resin-made molded article having a low heat-resistant temperature and an external connection terminal provided on a flexible sheet are joined via soldering, the resin-made molded article will not be thermally damaged.

Soldering can be performed in a suitable manner.

High productivity can be realized.

DESCRIPTION OF EMBODIMENTS

Figure 1:
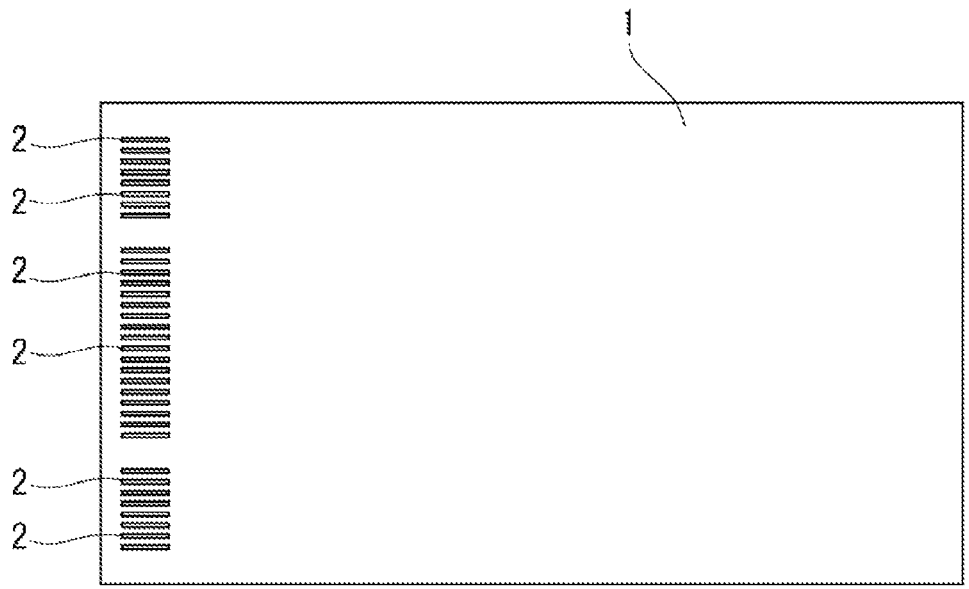
FIG. 1 is a plan view of a sheet.

The present invention is directed to a method for manufacturing electrical products. The electrical products include electronic products. An example of the products includes portable terminals (e.g., handheld information terminals). In addition, examples of the products include information equipment and video equipment. The products also include parts in addition to end products.

The method includes an arranging step. The arranging step is a step of arranging a molded body made of thermoplastic resin and a flexible sheet (FPC) such that the molded body and the flexible sheet are arranged facing each other. Connection terminals exposed to a surface of the molded body and connection terminals exposed to a surface of the flexible sheet are arranged facing each other. The molded body is provided with wirings each having a predetermined pattern and the connection terminals. All of or a part of the connection terminals are exposed to the surface of the molded body. There is the following relationship: (a width of the respective connection terminals exposed to the surface of the molded body: a2)>(a width of the respective wirings of the molded body: a1). The flexible sheet (FPC) is provided with wirings each having a predetermined pattern and the connection terminals. All of or a part of the connection terminals are exposed to the surface of the flexible sheet. There is the following relationship: (a width of the respective connection terminals exposed to the surface of the flexible sheet: b2)>(a width of the respective wirings of the flexible sheet: b1).

The molded body is made of a thermoplastic resin. Particularly, the molded body is made of a resin having a melting point equal to or less than 300° C. Preferably, the molded body is made of a resin having a melting point equal to or more than 100° C. It becomes more difficult to form a two-dimensional sheet into a three-dimensional shape by thermoforming, as a melting point (heat-resistant temperature/softening point) becomes higher. In the light of thermoforming property, a thermoplastic resin having a melting point equal to or less than 300° C. is essential in the present invention. More preferable thermoplastic resin has a melting point equal to or less than 270° C. Further preferable thermoplastic resin has a melting point equal to or less than 260° C. In the present invention, solder joint is an essential step. Therefore, it is essential for resin to withstand a soldering temperature. A melting point of solder is, generally, about 190-230° C. For example, tin/silver/copper alloy has a melting point of 218° C. Tin/zinc alloy has a melting point of 197° C. Tin/copper alloy has a melting point of 227° C. Therefore, it is preferable for the resin to have a melting point equal to or more than 100° C. More preferable resin had a melting point equal to or more than 130° C. A heat-resistant temperature (softening point) generally is lower than a melting point. For the reasons as set forth above and a fact that the solder joint is provided only partially, there was no serious problem even in a case where a melting point of resin was somewhat lower than a melting point of solder. There was a problem when a melting point of resin was largely lower than a melting point of solder. In this regard, resin having a melting point of the above described range was preferred. Since the present invention includes a thermoforming step, it was required that the resin be a thermoplastic resin. Examples of the resin include olefin resin (e.g., polyethylene (melting point: 95-140° C., heat-resistant temperature: 70-110° C.) and polypropylene (melting point: 168° C., heat-resistant temperature: 100-140° C.), etc.). Further example of the resin includes acrylic resin (Methacrylic resin is also included. melting point: 160° C., (heat-resistant temperature: 70-90° C.). Further another example of the resin includes polyester resin (e.g., PET (melting point: 255° C., heat-resistant temperature: 200° C.)). Further another example of the resin includes styrene resin (melting point: 100° C., heat-resistant temperature: 70-90° C.). Further another example of the resin includes AS resin (melting point: 115° C., heat-resistant temperature: 80-100° C.). Further another example of the resin includes ABS resin (melting point: 100-125° C., heat-resistant temperature: 70-100° C.). Further another example of the resin includes vinyl chloride resin (melting point: 85-180° C., heat-resistant temperature: 60-80° C.). Further another example of the resin includes amide resin (e.g., nylon resin (melting point: 225° C., heat-resistant temperature: 80-140° C.). Further another example of the resin includes acetal resin (melting point: 181° C., heat-resistant temperature: 80-120° C.). Still further another example of the resin includes polycarbonate (melting point: 150° C., heat-resistant temperature: 120-130° C.).

The flexible sheet is also made of a resin. Preferably, the flexible sheet is made of a resin having a high heat-resistant temperature. Specifically, the flexible sheet is made of a resin satisfying the following relationship: [(a heat-resistant temperature of a resin forming the flexible sheet)>(a heat-resistant temperature of a resin forming the molded body)]. An example of the resin having a high heat-resistant temperature includes imide resin (thermosetting resin: heat-resistant temperature equal to or greater than 500° C.). Unlike the molded body, it is not essential for the flexible sheet to be subjected to thermoforming. Therefore, a low heat-resistant temperature (heat distortion temperature) is not required for the flexible sheet. Considering an adverse effect suffered from the below mentioned soldering step, it is preferable for the flexible sheet to have a high heat-resistant temperature. The flexible sheet is generally thin. Consequently, it is preferable that the flexible sheet is made of a material more rich in heat-resisting property than the molded body. It is preferable that the flexible sheet is made of a resin having a heat-resistant temperature beyond 300° C. Generally, a thermosetting resin is excellent in heat-resisting property. Accordingly, it is preferable that the flexible sheet is made of a thermosetting resin. Meanwhile, there is a case where a polyester resin is used.

The method includes an electromagnetic induction heating step. The electromagnetic induction heating step is performed after the arranging step. Electromagnetic induction induces heat generation. Solder disposed between the connection terminals (conductive material: metal) of the molded body and the connection terminals (conductive material: metal) of the flexible sheet is molten by the electromagnetic induction heating. As a result thereof, the connection terminals of the molded body and the connection terminals of the flexible sheet are joined together.

The molded body is inferior in heat-resisting property, as compared to the flexible sheet. In order to improve the defects induced by a low heat-resisting property, the molded body is formed thicker (into a thick-walled molded body). More specifically, preferable thickness of the molded body (preferable thick-walled molded body has) was 0.5 (more preferably, 1 mm or greater)-2 mm. As the molded body becomes thicker, a degree of thermal damage of the molded body becomes low. However, the thickness makes thermoforming of the molded body difficult. To the contrary, if the molded body is thin, a resulting molded body includes conspicuous thermal damage. In view of the above, preferable thickness of the molded body was within the above described range. The width a1 of the respective wirings formed on the molded body was, for example, 5-100 μm. The width a2 of the respective connection terminals of the molded body was, for example, 100 (preferably, 150 μm or greater)-500 μm. There was the following relationship: a2>a1. A preferable size of an exposed portion of the respective connection terminals was 0.3 (more preferably, 0.5 mm$^2$ or greater)-1.5 mm$^2$. A heat vale Q generated by electromagnetic induction is expressed by the following formula: Q=(V$^2$/R)×t [V=applied voltage, R=resist, and t=time]. If the size is too small, a heat value generated by electromagnetic induction is small. This makes soldering property inferior. If the size is too large, a heat value generated by electromagnetic induction becomes large. This led to a concern of thermal damage of the molded body. Considering the above, a preferable size of single connection terminal (a size of an exposed portion of single connection terminal) was 0.3-1.5 mm$^2$. When comparing connection terminals with wirings, a width of the respective connection terminals is wider than that of the respective wirings. This means that connection terminals have a width wider than the wirings in a size per unit length. In other words, a heat value generated by electromagnetic induction of a portion of the connection terminals is more than that of a portion of the wirings. A heat value is small in the portion of wirings. This means that only solder disposed on the portion of connection terminals is heated. No thermal damage of molded body is seen.

A preferable thickness of the flexible sheet (thick-walled flexible sheet has) was 25-300 μm (more preferably, equal to or below 200 μm; further preferably, equal to or below 150 μm; specifically preferably, equal to or below 50 μm; still further preferably, equal to or greater than 30 μm). A width b1 of the respective wirings formed on the flexible sheet was, for example, 50-100 μm. A width b2 of the respective connection terminals of the flexible sheet was, for example, 150-500 μm. A size of single connection terminal (a size of an exposed portion of single connection terminal) was, preferably, 0.3 (more preferably, equal to or greater than 0.5 mm$^2$)-1.5 mm$^2$.

The flexible sheet satisfies the following relationship: [(a heat-resistant temperature of a resin forming the flexible sheet)>(a heat-resistant temperature of a resin forming the molded body)]. This means that flexibility is essentially required for the flexible sheet. A flexible sheet is required to be thin. As a flexible sheet becomes thinner, the flexible sheet is suffered from more thermal damage. Therefore, even if a flexible sheet is thin, if a melting point of a resin that forms the flexible sheet is higher than a melting point of a resin that forms a molded body, the flexible sheet is hardly suffered from thermal damage.

The molded body is manufactured via, for example, a wiring pattern forming step and a molding step. The wiring pattern forming step is a step of forming the wirings and the connection terminals on the resin sheet. Wiring pattern forming step is publicly known. As a matter of course, wiring pattern forming step is not limited to any of the publicly known arts. The molding step is a step of heating a resin sheet, on which the wiring patterns are formed, to form the resin sheet into a predetermined shape. The molding step is, for example, a hot press step. Molding step is publicly known. As a matter of course, molding step is not limited to any of the publicly known arts. The molded body is manufactured via the molding step.

The electromagnetic induction heating step is performed such that the molded body is not suffered from thermal damage by the electromagnetic induction heating. An electromagnetic induction heating device is publicly known. As a matter of course, a new electromagnetic induction heating device may be used. The patent literature 2 discloses that a portion of a resin-made case is molten by electromagnetic induction heating. In the patent literature 2, the melting phenomenon is positively used. However, the present invention seeks a solution for not being suffered from such thermal damage (melting). The patent literature 1 discloses that electromagnetic induction heating is used for heating (melting) solder. However, FPC of the patent literature 1 is FPC using a polyimide (PI) film. Polyimide has a heat-resistant temperature equal to or greater than 500° C. Therefore, FPC is free from being molten (being suffered from thermal damage), even when the FPC is heated to a soldering temperature. Therefore, it is not possible, in a case where a resin inferior in heat-resisting property is essential, to get a clue from the patent literatures 1 and 2 as to what is necessary for avoiding generation of thermal damage during electromagnetic induction heating as well as for obtaining fine solder joint. In other words, the present invention never be conceived from the patent literatures 1 and 2.

Hereinafter, more detailed descriptions of embodiments follow. However, it should be noted that the present invention is not limited only to the following embodiments and various modifications and applications may be made without departing from the spirit and scope of the invention.

Figure 2:
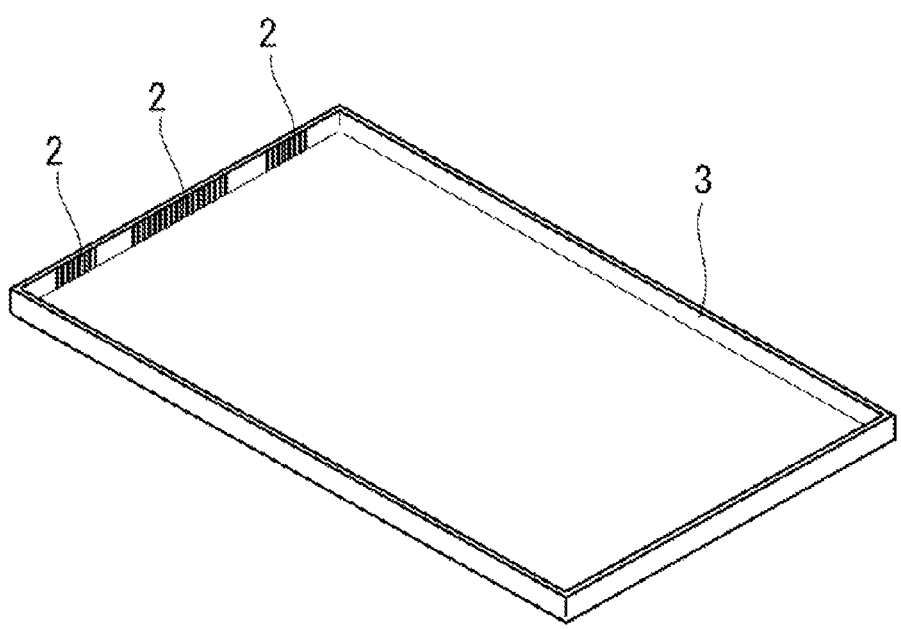
FIG. 2 is a perspective view of a molded body.
Figure 3:
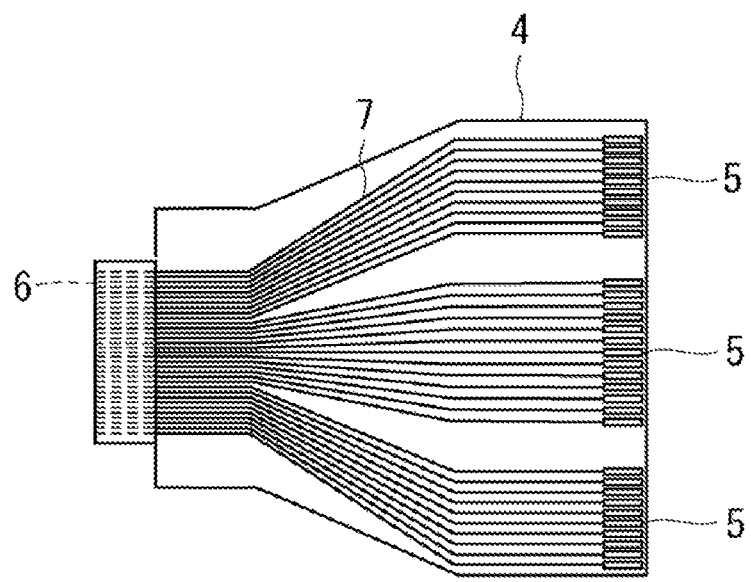
FIG. 3 is a plan view of a flexible sheet.
Figure 4:
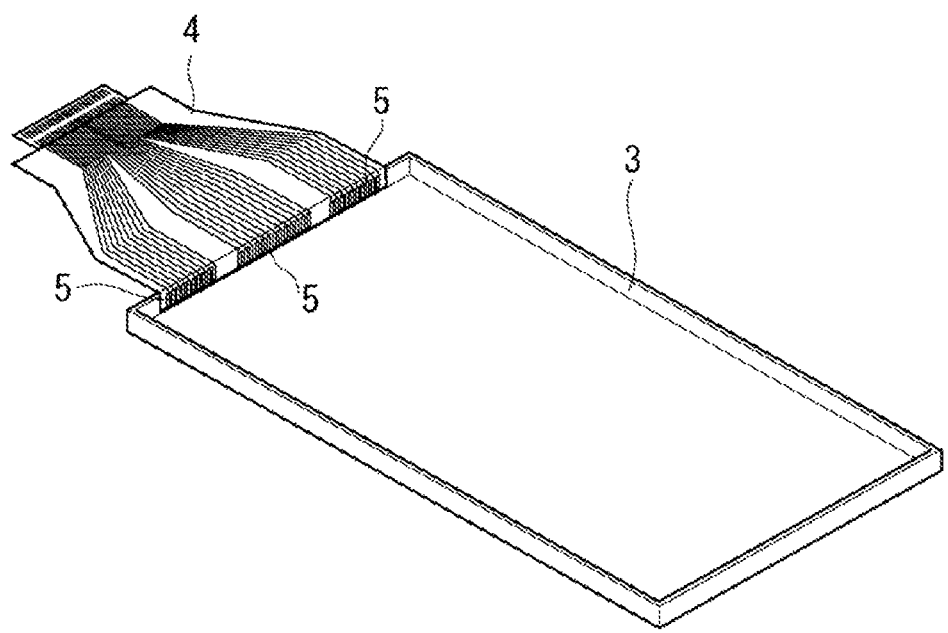
FIG. 4 is a perspective view of a product composed of a molded body and a flexible sheet which are joined together via soldering.

FIG. 1 through FIG. 4 illustrates a manufacturing method according to the present invention. FIG. 1 is a plane view of a sheet. FIG. 2 is a perspective view of a molded body (a molded body obtained by thermoforming the sheet of FIG. 1 into a predetermined shape). FIG. 3 is a plane view of the flexible sheet. FIG. 4 is a perspective view of a product composed of the flexible sheet and the molded body which are joined together via soldering.

Initially, a transparent resin-made (e.g., acrylic resin excellent in transparency) square sheet (thickness: 1.5 mm) 1 was prepared. An electrode having a predetermined pattern was formed on each of a front surface and a back surface of the sheet 1 made of PMMA. Lead-out wirings (width: 0.1 mm) were formed. Further, external connection terminals 2 were formed. The terminals have a rectangular shape (width: 0.5 mm, length: 3 mm) (see, FIG. 1). The electrodes, the lead-out wirings, and the terminals 2 are electrically connected one another. Both of the electrodes and the lead-out wirings are made of a transparent material, so that they are not illustrated here. The terminals 2 are also made of a transparent material. However, for convenience of description, the terminals 2 are illustrated. A publicly known art is employed, as required, for forming the electrodes, the lead-out wirings, and the terminals 2. Therefore, detailed descriptions thereof are omitted here.

The sheet 1 on which the external connection terminals 2, etc., are formed is formed into a molded body 3 having a three-dimensional shape (e.g., a case shape) by thermoforming (see, FIG. 2). A shape of the molded body 3 varies according to a product to be manufactured. PMMA has a heat-resistant temperature of 70-90° C. PMMA has a softening point of 80-100° C. PMMA has a melting point of 160° C. Therefore, the sheet 1 made of PMMA can be readily thermoformed. A publicly known art is employed for the thermoforming, as required. Therefore, a detailed description thereof is omitted here.

4 denotes a flexible sheet (FPC). A structural material (resin) of the flexible sheet 4 is a polyimide resin. The flexible sheet 4 has a heat-resistant temperature equal to or greater than 500° C. The flexible sheet 4 has a thickness of 40 µm. The flexible sheet 4 is provided with external connection terminals 5 and 6 formed thereon. The terminals 5 and the terminal 6 are connected to each other via lines 7 each having a width of 0.1 mm. The terminals 5 have a shape identical to the terminals 2. An area between the terminals 5 and the terminals 6 is covered with an insulating film. Portions of the terminals 5 and the terminals 6 are not covered with an insulating film. That is, surfaces of the terminals 5 and the terminals 6 are exposed.

The molded body 3 and the flexible sheet 4 are butted to each other such that the terminals 2 face to the terminals 5. Solder (tin/silver/copper alloy: melting point=218° C.) is disposed between the terminals 2 and the terminals 5. A temporary fastening body that fastens the molded body 3 to the flexible sheet 4 was arranged within the electromagnetic induction heating device. Electromagnetic induction heating was performed. As a result thereof, the terminals 2 and the terminals 5 were joined finely by using solder. Though solder was molten, thermal damage was never found in the molded body 3. The molded body 3 has low heat-resisting property. The molded body 3 has a melting point at or around 160° C. No thermal damage was found in the molded body 3 even after solder joint. This was unexpected. It has not been learned that electromagnetic induction heating which causes only small sized metal parts to generate heat can be effectively applied to solder joint for a resin product having a low heat-resisting property. Further, time for soldering operation can be saved.

A heating furnace was used instead of electromagnetic induction heating. In this case, thermal damage was found in PMMA-made molded body.

A test was made in joint between terminals by laser beam irradiation, instead of electromagnetic induction heating, to melt solder. However, as seen from FIG. 1, there are many terminals in an electrical product. Therefore, joint by laser beam irradiation provided extremely poor operability (productivity).

REFERENCE CHARACTER LIST 1 sheet made of PMMA
2 external connection terminal
3 molded body
4 flexible sheet
5, 6 external connection terminal

The invention claimed is:

1. A method for manufacturing an electrical product including a molded body and a flexible sheet, wherein the molded body is made of a thermoplastic resin having a melting point equal to or less than 300° C. but no lower than 100° C., wherein the flexible sheet is made of a resin better in heat-resisting property than the resin composing the molded body, wherein the molded body is provided with at least wiring having a predetermined pattern and a connection terminal having a width a2 wider than a width a1 of the wiring, wherein the flexible sheet includes at least wiring having a predetermined pattern and a connection terminal having a width b2 wider than a width b1 of the wiring, wherein the molded body has: a thickness of 0.5-2 mm, a width a1 of the wiring of 5-100 µm, a width a2 of the connection terminal of 100-500 µm, and a relationship: a2>a1, and wherein the flexible sheet has: a thickness of 25-300 µm, a width b1 of the wiring of 50-100 µm, and a width b2 of the connection terminal of 150-500 µm, the method comprising:

arranging the connection terminal of the molded body and the connection terminal of the flexible sheet such that the connection terminals face each other;

performing an electromagnetic induction heating after the arranging; and joining together the connection terminal of the molded body and the connection terminal of the flexible sheet using solder, wherein the connection terminal of the molded body is able to withstand a temperature of the solder, wherein solder provided between the connection terminal of the molded body and the connection terminal of the flexible sheet is molten by the electromagnetic induction heating.

2. The method for manufacturing an electrical product according to claim 1, wherein a size per single connection terminal in the molded body is 0.3-1.5 mm$^2$, and wherein a size per single connection terminal in the flexible sheet is 0.3-1.5 mm$^2$.

3. The method for manufacturing an electrical product according to claim 1, wherein the molded body is obtained via a wiring pattern forming providing the wiring and the connection terminal on the sheet made of a thermoplastic resin, and a molding in which the sheet is heated to be formed into a predetermined shape after the wiring pattern forming.

4. The method for manufacturing an electrical product according to claim 1, wherein the molded body is composed of a thermoplastic resin selected from the group consisting of olefin resin, acrylic resin, polyester resin, amide resin, styrene resin, AS resin, ABS resin, vinyl chloride resin, acetal resin, and polycarbonate resin, and wherein the flexible sheet is composed of a resin selected from the group consisting of imide resins.

* * * * *